United States Patent
Gubisch et al.

[11] Patent Number: 5,642,300
[45] Date of Patent: Jun. 24, 1997

[54] PRECISION VOLTAGE/CURRENT/POWER SOURCE

[75] Inventors: Andrew D. Gubisch, Arlington; James L. West, Concord, both of Mass.; Petar Miljanic, Belgrade, Yugoslavia; Paul L. Lualdi, Jr., Wellesley, Mass.

[73] Assignee: Rotek Instrument Corp., Waltham, Mass.

[21] Appl. No.: 592,133

[22] Filed: Jan. 26, 1996

[51] Int. Cl.⁶ .................. H03M 1/10; G01R 35/00
[52] U.S. Cl. ................. 364/571.01; 364/571.04; 364/571.07; 324/141; 324/142
[58] Field of Search .................. 364/483, 571.01, 364/571.04, 150, 151, 571.07; 324/141, 142, 130

[56] References Cited

U.S. PATENT DOCUMENTS

| | | | |
|---|---|---|---|
| 4,799,008 | 1/1989 | Kannari | 324/73 |
| 4,823,251 | 4/1989 | Kawabata et al. | 363/95 |
| 4,903,023 | 2/1990 | Evans et al. | 341/120 |
| 4,924,412 | 5/1990 | Leydier | 364/483 |
| 5,030,922 | 7/1991 | Rumreich et al. | 330/253 |
| 5,039,872 | 8/1991 | Oldham | 327/106 |
| 5,061,890 | 10/1991 | Longini | 364/483 |
| 5,122,725 | 6/1992 | Kitamura et al. | 323/247 |
| 5,168,208 | 12/1992 | Schultz et al. | 322/25 |
| 5,249,150 | 9/1993 | Gruber et al. | 364/572 |
| 5,359,275 | 10/1994 | Edwards | 323/207 |

OTHER PUBLICATIONS

Manual—Rotek Precision Calibration Instrumentation, Series 800, Precision Power/Energy Meter Calibrators, Rotek Instrument Corp.

*Primary Examiner*—Emanuel T. Voeltz
*Assistant Examiner*—Demetra R. Smith

[57] ABSTRACT

In the precision source disclosed herein, a reference waveform and a correction waveform are combined and fed to an output amplifier which supplies an output waveform to a load, e.g., a wattmeter under test. The reference and correction waveforms are generated by digital-to-analog conversion of values stored in respective data tables. The output waveform is then combined with the reference waveform to obtain an error signal which is then digitized and utilized to update the data table from which the correction waveform is generated.

8 Claims, 5 Drawing Sheets

PRECISION VOLTAGE/CURRENT/POWER SOURCE

BACKGROUND OF THE INVENTION

The present invention relates to precision signal sources and more particularly to a power source which will accurately supply preselected voltage and current waveforms, precisely related in time, for use in the calibration of electrical measurement equipment, e.g., power meters.

In order to calibrate watt-hour meters and other power measurement devices, it is necessary to provide precisely defined reference waveforms, current and voltage, which are also precisely related in time or phase. Heretofore, power calibration sources have been implemented as essentially analog devices using voltage controlled oscillators and precision feedback systems to maintain the desired waveform accuracy and phase relationships. While various systems employing digital techniques have been proposed for other types of precision sources, e.g., for the measurement of core losses in transformers and the like, these prior art systems have not been readily adaptable or sufficiently precise for use as precision power calibration standards.

Among the several objects of the present invention may be noted the provision of novel apparatus for generating a precisely defined waveform; the precision of such apparatus which will generate both current and voltage waveforms; the provision of such apparatus which will generate current and voltage waveforms in precisely defined phase or time relationships; the provision of such apparatus which will generate precision waveforms of preselectable wave shape; the provision of such apparatus which is easily adjustable as to operating parameters, including amplitude and phase; the provision of such apparatus which is highly reliable and which is of relatively simple and inexpensive construction. Other objects and features will be in part apparent and in part pointed out hereinafter.

SUMMARY OF THE INVENTION

The precision source of the present invention employs an amplifier for applying an output waveform to a load. A first memory section or table holds digital reference values representing the relative amplitude of a desired waveform at a succession of points. A second memory section or table stores digital correction values corresponding to respective ones of the reference values. Successive values read from the first memory are applied to a first digital analog converter to generate a reference waveform and, synchronously, corresponding values read from the second memory section are applied to a second digital-to-analog converter to generate a correction waveform. The reference and correction waveforms are combined and applied to the input of the amplifier with the output of the amplifier being applied to the load resulting in an output waveform. The output waveform is combined with the reference waveform to generate an error signal. This error signal is, in turn, digitized and employed for updating the correction values stored in the second memory section.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
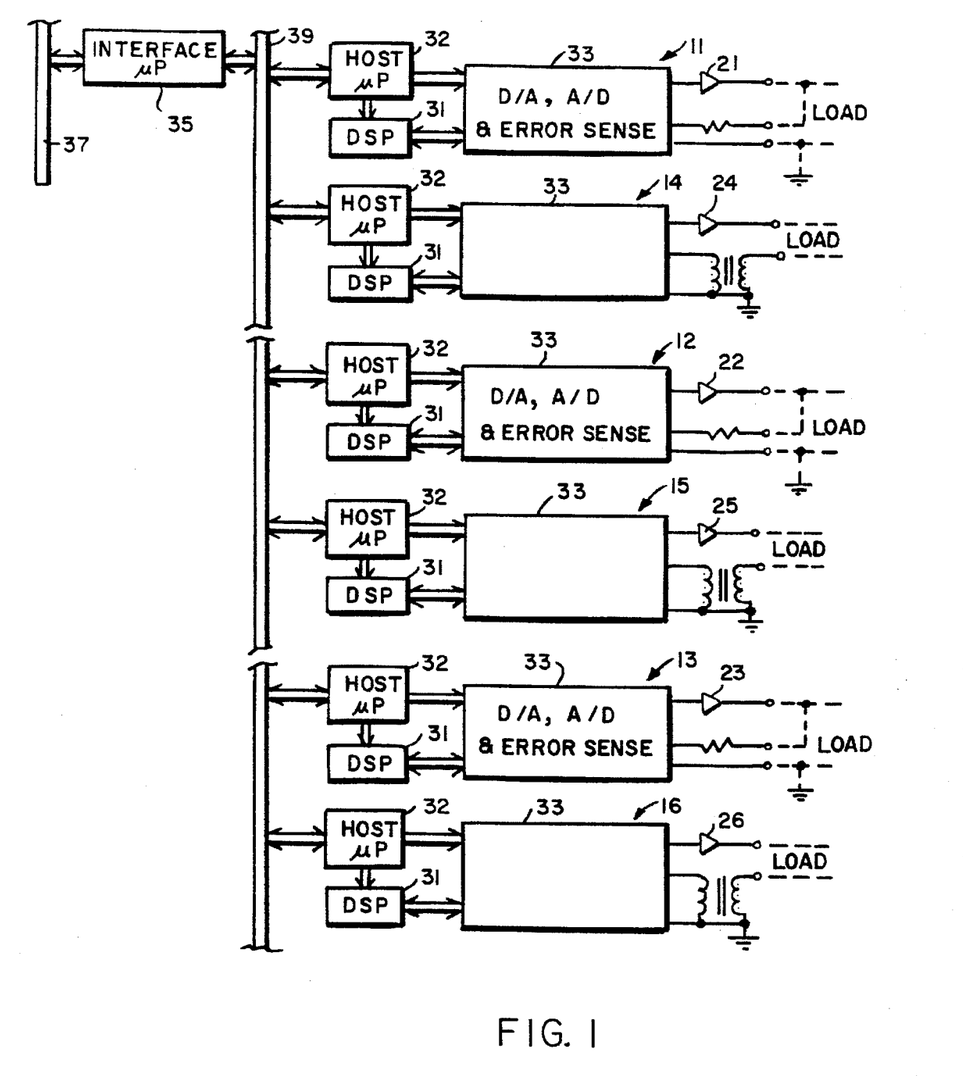
FIG. 1 is an overall block diagram of a precision power calibration apparatus in accordance with the present invention.

Referring now to FIG. 1, the apparatus illustrated there is adapted for calibrating multi-phase power meters and, to this end, incorporates six separate but similar source channels, three voltage source channels designated generally by reference characters 11–13, and three current source channels designated generally by reference characters 14–16. The voltage and current source channels are similar except that the voltage source channels sense output voltage through a resistor to obtain a feedback signal while the current channels sense current, as measured through respective current transformers RC, to obtain their feedback signals.

Each of the channels includes an output amplifier for applying an output waveform to the respective load terminal, the voltage output amplifiers being designated by reference characters 21–23 and the current output amplifiers being designated by reference characters 24–26. Each channel also includes a digital signal processor 31 and hybrid error sensing and correction circuitry 33 which is essentially the same from channel to channel.

As is increasingly conventional with all types of instrumentation, a microprocessor 35 is provided for overall coordination and sequencing of operations and for implementing a user interface. Microprocessor 35 is coupled to both a control panel 37 which provides a keyboard and display for user interaction and to a bus or backplane 39 which implements data transfer,between the interface microprocessor and the digital signal processors 31 for the various channels.

Figure 2:
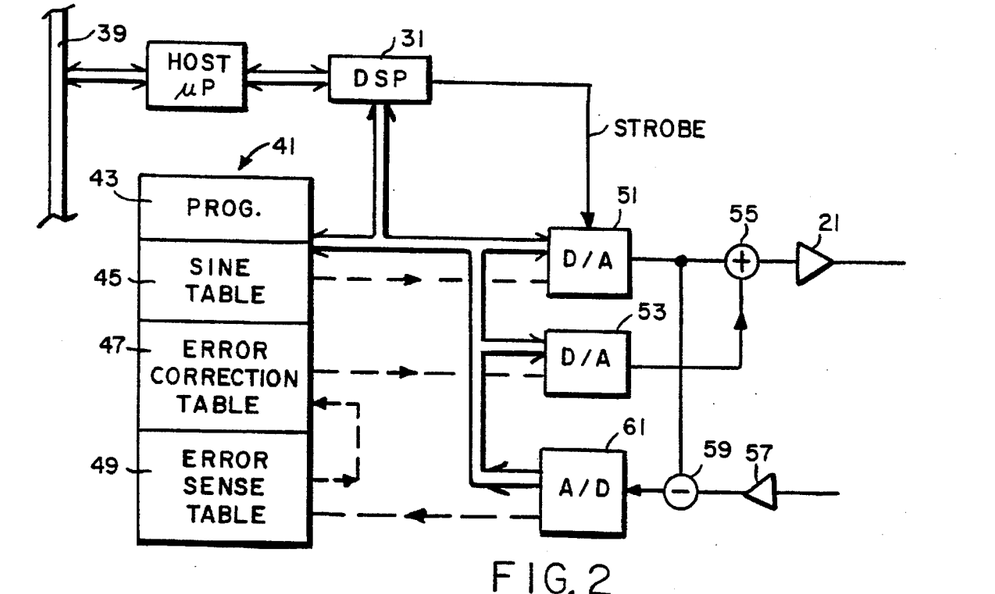
FIG. 2 is a block diagram illustrating in greater detail one of the several similar waveform source channels employed in the apparatus of FIG. 1.

Referring now to FIG. 2, there is associated with the digital processor 31 a random access memory 41. As will be understood by those skilled in the art, data stored in the memory 41 may be utilized for various purposes, but in connection with the present invention, it is convenient to consider the memory 41 as providing four separate functions. In the following description, these functions are conveniently described as being performed by different sections of the memory but, as understood by those skilled in the art, the data associated with the different sections need not, in fact, be contiguous.

A portion of memory 41, designated by reference character 43, provides the program under which the digital signal processor 31 operates and basically establishes the sequencing of events in conventional manner. Another section of memory, designated by reference character 45, is employed for storing a table of reference values which represent the relative amplitude of a desired waveform at a succession of phase points or times within the waveform cycle. Most typically, the succession of reference values will represent a sinusoidal waveform. If only a sinusoidal waveform is utilized, these values could be stored in a read-only memory (ROM), as understood by those skilled in the art. However, one of the advantages of the architecture of the present invention is that the waveform shape can be preselected, e.g., to include harmonics if testing under such conditions is desired.

Another section of memory 41 stores an error correction table, designated by reference character 47, containing values which are generated as described hereinafter. A further portion 49 of memory 41 may be employed as an error sense table, but this functionality may also be provided by registers holding transient values in the overall digital processing scheme as will be apparent to those skilled in the art.

The data loaded into the program section 43 and the reference waveform section 45 will typically originate in the host microprocessor 32 and will be transferred to these sections through operations of the digital signal processor, though it should be understood that a direct memory access (DMA) mode of operation might also be implemented. Likewise, while data transfers between the different memory sections and various D to A and A to D convertors are typically implemented through the operations of the digital signal processor 31, it is convenient for the purposes of description to consider the flow of data directly between the various tables and the several converters described hereinafter.

In operation, successive values are read sequentially from the reference waveform portion 45 of the memory and are loaded into a digital-to-analog converter 51. Synchronously, successive values are read from the error correction table 47 and loaded into a second digital-to-analog converter 53. A strobe signal generated by the digital signal processor 31 causes the two converters 51 and 53 to perform their conversions essentially simultaneously and to generate corresponding analog voltage output signals. The successive signal amplitudes generated by these two converters thus constitute a reference waveform and a correction waveform respectively. The reference waveform and the correction waveform are combined in a summing junction or amplifier 55 and the resultant waveform is applied as the drive or input signal to the respective power amplifier 21.

The feedback signal, which is a direct characterization of the output signal of amplifier 21, is applied, through a buffer amplifier 57, to a summing junction or amplifier 59 which has, as its second input, the reference waveform obtained from the digital-to-analog converter 51. The reference waveform is effectively subtracted from the feedback signal and the difference level, which may be characterized as an error signal is applied to an analog-to-digital converter 61. The digitized error signal is stored in the respective section 49 of memory 41 and the values obtained are then employed to update the error correction table 47.

As indicated previously, the values stored in the error sense table 49 will be transferred to the error correction table 49 by the digital signal processor 31. While, in some situations, the digitized error values as sensed may be used directly to load the error correction table, it is typically preferable that some arithmetic operations be performed by the digital signal processor, e.g., to remove any d.c. offset which may have arisen through the operations of the buffer amplifier 57 or analog-to-digital converter 61. The digital signal processor can determine the d.c. offset by effectively integrating the entire error signal waveform, as will be understood by those skilled in the art. Basically, however, the amplitude of the error signal digitized is used to load the error correction table.

Although the analog-to-digital converter 61 is strobed essentially simultaneously with the digital-to-analog converter 51 and 53, it will be understood that the error value obtained is essentially that resulting from a previous output of the digital-to-analog converters and this sample-period offset is allowed for in setting the program pointers which control the reading of values from the reference waveform table 45 and the error correction table 47.

As will be understood by those skilled in the art for the foregoing description, the ongoing operation of this apparatus will cause the values in the error correction table 47 to be continuously updated in a manner which will continually reduce the errors. Accordingly, even though the amplifier 21 necessarily introduces some errors, these errors will be effectively reduced by the loop gain of the feedback system which updates the error correction table. As will also be understood by those skilled in the art, the errors which occur across the amplifier 21 can be influenced by changes in the character of the load. These errors also will be counteracted by the digital feedback scheme of the present invention provided of course that the frequency content of the error is not greater than one-half of the sampling rate.

While the detailed implementation of the components which provide the combining of signals and the error feedback will vary from implementation to implementation depending upon the suitability of available components, a preferred form of circuitry for implementing these functions is described in connection with FIGS. 3 through 8.

Figure 3:
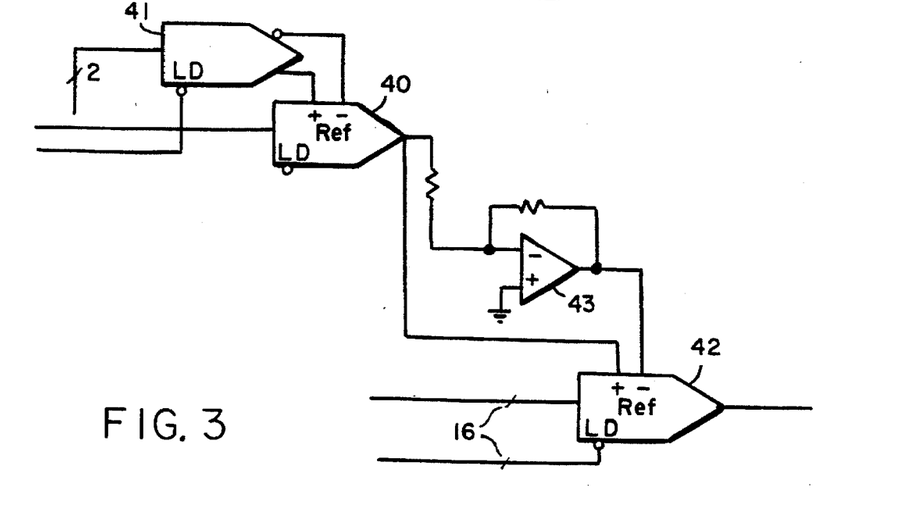
FIG. 3 is a circuit diagram illustrating the main voltage waveform digital to analog converter and amplitude control system.

FIG. 3 illustrates the main D/A converters. The main D/A section consists of an amplitude control D/A converter 40 & 41 a gain of 1 inverting amplifier, 43, that converts the unipolar output of 140 to symmetrical bipolar voltages for use as references for the waveform D/A converter, and the waveform D/A 142.

In order to achieve the desired 18 bit amplitude control resolution, a standard 16 bit D/A converter 40 is used and supplemented with an additional 2-bit adjustment, 41. The additional resolution is achieved by manipulating the voltage at the reference inputs of the 16 bit amplitude D/A converter. Both the 16 Bit converter and the 2 bit converter are loaded by the host microprocessor by strobing their respective "LD" inputs which causes the converters to latch in a new digital values.

The main waveform is generated by sending a digitized version of the waveform to the main waveform D/A converter, 42, one sample at a time. First, the DSP presents a new digital value to the D/A digital inputs. Next, the DSP sends a "STROBE" pulse to the D/A converter which causes it to load the new digital value and produce the new output voltage.

In the current invention it was found that a suitable sine wave, or other waveform, could be generated using max of 400 samples to represent the entire cycle. In practice it has been found desirable to vary the number of samples somewhat to accommodate the discrete increments of time available for each sample. The values actually used are 186 samples at 60 Hz, 221 samples at 50 Hz and 58 samples at 400 Hz. The number of samples per cycle and the time duration for each sample may change when the frequency changes.

Figure 4:
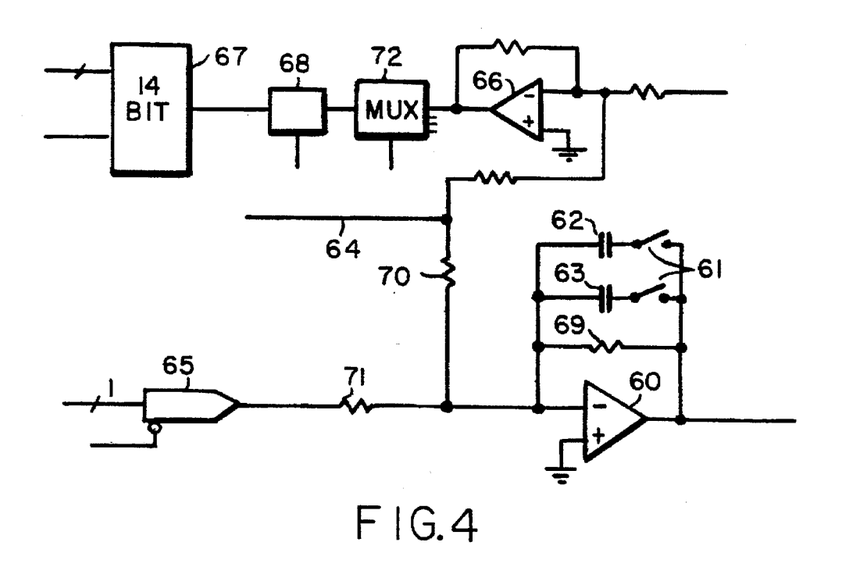
FIG. 4 is a circuit diagram illustrating the digital to analog and analog to digital portion of the voltage source's digital feedback system as well as the correction summing amplifier.

FIG. 4 illustrates the summing amplifier 60, that combines the input, 64, from the main waveform D/A 42, and the correction D/A, 65. Also illustrated is the subtractor 66, which generates an analog error signal that is proportional to difference between the desired output and the actual output of the channel. The output of the subtractor is then coupled through an analog multiplexer and a switchable gain amplifier to the error converter, 67.

The summing amplifier 60, is, in addition to summing the main and correction signals, used to smooth the digitally synthesized waveform by functioning as a low pass filter. To operate as a low-pass filter, the amplifier is equipped with capacitors 62 and 63 which may be individually switched in or out by the DSP with the digitally controlled analog switches 61. The present invention has been found to operate best when the input resistors 70 and 71 are each 10,000 ohms, the feedback resistor 69, is 14,020 ohms and each capacitor 62 and 63, is 9.7 nanoFarads.

The correction D/A 65, has a serial digital input which is coupled to the DSP. After the DSP loads the D/A with data, the STROBE signal is used to cause the D/A to convert the new data to an analog correction voltage output.

The subtractor 66, the A/D converter 67 and the switchable gain amplifier 68, all work together to provide an accurate digital representation of the error present in the channel output. The A/D 67 is a serial A/D that communicates the converted digital value to the DSP using a 3 wire serial. In order to sample in a consistent manner, the A/D is signaled to convert the value presented on its analog input by the STROBE signal, thus allowing the maximum time for output settling before sampling.

The multiplexer ("MUX") 72, allows the Error A/D to also be used to make diagnostic measurement within the instrument to diagnose faults and verify proper calibration and operation. Use of the MUX has been found advantageous in the present invention.

Figure 5:
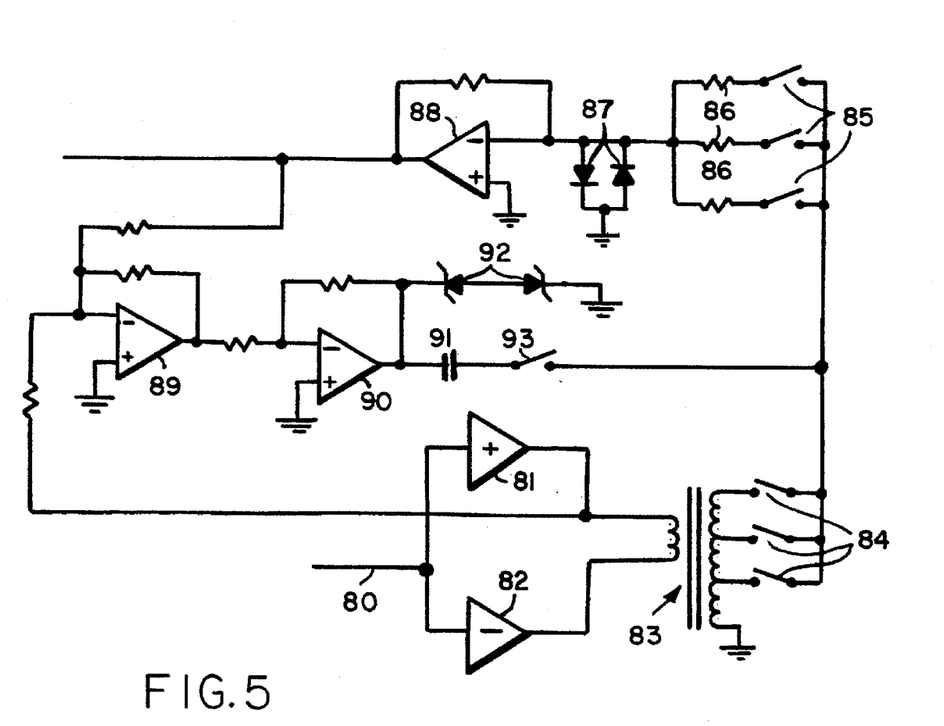
FIG. 5 is a circuit diagram illustrating the voltage output driver and local feedback circuitry.

FIG. 5 illustrates the voltage channel output stage. Here, an input signal, 80, of five volts RMS can be transformed into an output signal of nearly one thousand volts RMS. The output stage includes a "bridge" amplifier driving a step-up transformer, a feedback circuit, an AC coupled feed-forward compensation circuit and ranging relays that select the output tap of the transformer and the value of the feedback resistor. Because of the dynamic digital correction, in accordance with the practice of the present invention, the gain of the output stage need not be tightly controlled and compensated for all voltages levels and all frequencies.

The bridge amplifier, which consists of separate amplifiers 81 and 82, receives its input from the output of the summing amplifier, 60 and drives a step-up transformer 83. The input to the transformer is relatively low voltage, e.g., 10 volts RMS and relatively high current, e.g., about 4 Amperes RMS.

FIG. 5 also illustrates the selection relays used to select the output tap of the step-up transformer. The present invention is implemented using a transformer 83 having five (5) selectable output taps. This implementation yields ranges of maximum output voltage of 75, 150, 300, 600 and 800 volts RMS.

FIG. 5, also illustrates the use of selection relay contacts and the input resistors for 86 used to scale feedback in the same way the transformer scales output. In the present invention, one set of contacts is used to select the transformer tap, one set is used to select the input resistor. These relays are all controlled by the host microprocessor.

The feedback amplifier 88, provides a signal proportional to the output of the voltage channel which is scaled to the same voltage levels as the input of the output amplifier. The output of amplifier 88 is summed with the output of the waveform D/A, 42, by amplifier 66 to create an error signal. This is the outer or main digital feedback path.

A local AC coupled feed-forward compensation circuit, 89, 90, 91, the associated resistors and the selection relay 93 provide high frequency correction to the output when the circuit is selected by closing the relay contacts 93. The output of the feed-forward circuit is AC coupled to the output of the step-up transformer with a 200 microFarad capacitor. When the output of the channel is lower than the desired value, the output of the feed-forward output amplifier 90 corrects the output by applying current to the output of the step-up transformer, 83, through coupling capacitor, 91. When the output of the channel responds, the feedback circuit's amplifier 88 reflects the change. The feedback is applied to the feed-forward summing amplifier 89 which reduces the amount of correction applied through the coupling capacitor 91.

Because of the high voltages involved in the output of the voltage channel it is necessary to protect the semiconductor operational amplifiers from exposure to damaging voltages. To accomplish the protection of the input of 88 a pair of small signal silicon diodes, 87 1N914s, are used, to accomplish the protection of the output of 90, a pair of 20 volt zener diodes 92 are used.

Figure 6:
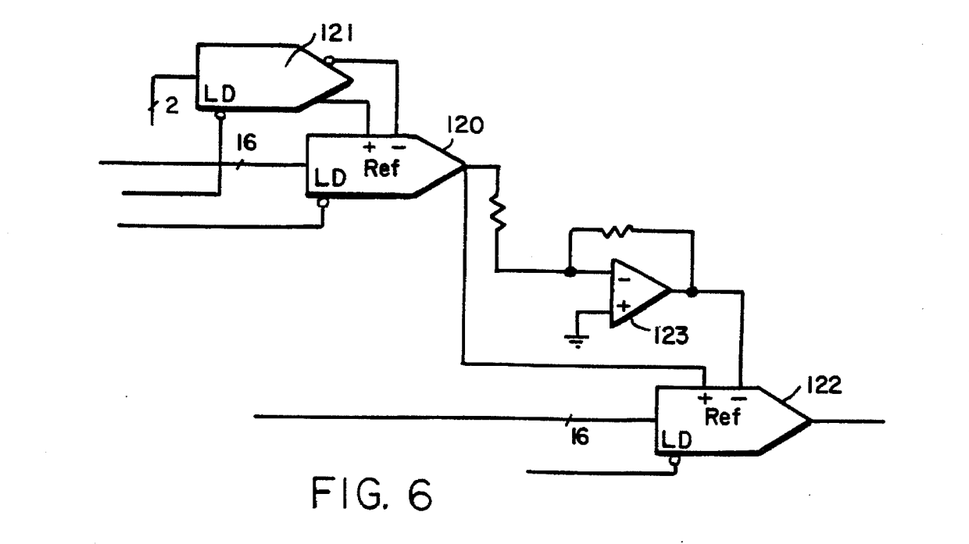
FIG. 6 is a circuit diagram illustrating the current waveform digital to analog converter and amplitude control system.

FIG. 6 illustrates the main D/A converters used in a current channel. The main D/A section consists of an amplitude control D/A converter, 120 & 121, a gain of 1 inverting amplifier 123 that converts the unipolar output of 120 to symmetrical bipolar voltages for reference inputs for the waveform D/A converter, and the waveform D/A 122.

In order to achieve the 18 bit amplitude control resolution, a standard 16 bit D/A converter, 120, is used and supplemented with an additional 2-bit adjustment, 121. The additional resolution is achieved by manipulating the voltage at the reference inputs of the 16 bit amplitude D/A converter. Both the 16 Bit converter and the 2 bit converter are loaded by the host microprocessor by strobing their respective "LD" inputs which causes the converters to latch in a new digital value.

The waveform is generated by sending a digitized version of the waveform to the main waveform D/A converter, 122, one sample at a time. First, the DSP presents a new digital value to the D/A digital inputs. Next, the DSP sends the "STROBE" pulse to the D/A converter which causes it to load the new digital value and produce the new output voltage.

All channels in a system operate at the same frequency, with the same number of samples per cycle. This is required because, in order to maintain synchronization between channels, each new waveform point is latched into the D/A converters with the same STROBE signal.

Figure 7:
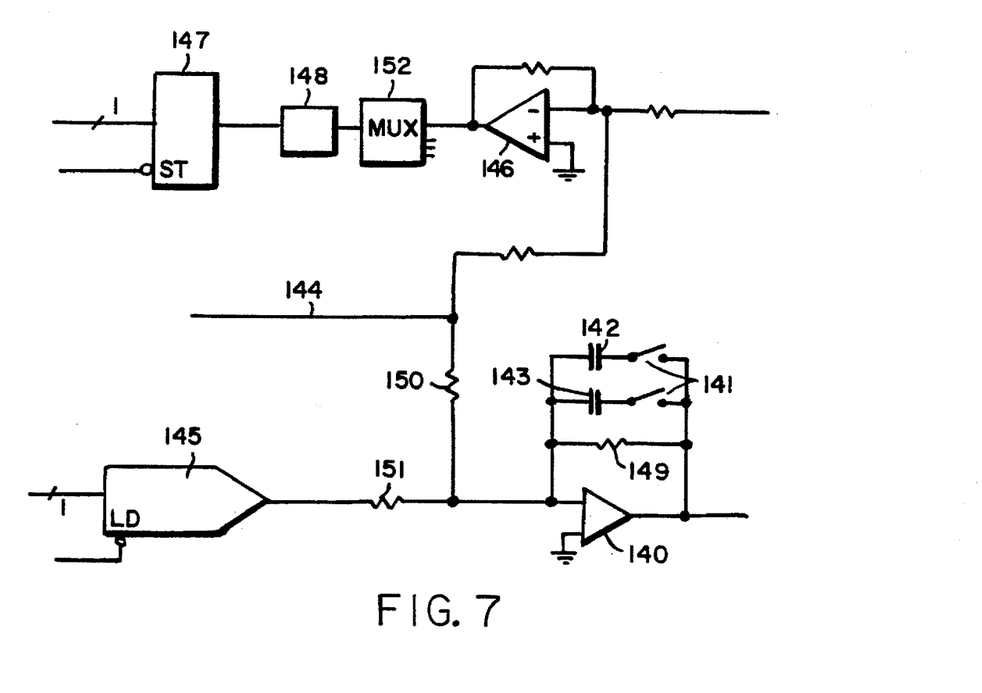
FIG. 7 is a circuit diagram illustrating the digital to analog and analog to digital portion of the current source's digital feedback system as well as the correction summing amplifier.

FIG. 7 illustrates the summing amplifier, FIG. 7, 140, that combines the input from the main waveform D/A, FIG. 6, 122, and the correction D/A, FIG. 7, 145. Also illustrated is the subtractor, 146, which generates an analog error signal that is proportional to difference between the desired output and the actual output of the channel. The output of the subtractor is then coupled through an analog multiplexer and a switchable gain amplifier to the error Analog to Digital (A/D) converter, 147.

The summing amplifier, 140, is, in addition to summing the main and correction signals, used to smooth the digitally synthesized waveform by functioning as a low pass filter. To operate as a low-pass filter, the amplifier is equipped with capacitors, 142 & 143, which may be individually switched in or out by the host microprocessor with digitally controlled analog switches, 141. The present invention has been found to operate best when the input resistors, 150 & 151 are each 10,000 ohms, the feedback resistor, 149, is 14,020 ohms and each capacitor, 142 & 143, is 4.7 nanoFarads.

The correction D/A, 145, has a serial digital input which is coupled to the DSP. After the DSP loads the D/A with data, the STROBE signal is used to cause the D/A to convert the new data to an analog correction voltage output.

The subtractor, 146, the A/D converter, 147 and the switchable gain amplifier, 148 all work together to provide a accurate digital representation of the error presented in the channel output. The A/D is a serial A/D that communicates the converted digital value to the DSP using a three wire serial interface. In order to sample in a consistent manner, the A/D is signaled to convert the value presented on its analog input by the STROBE signal, thus allowing the maximum time for the output to settle.

The multiplexer (MUX), 152, allows the Error A/D to be used to make diagnostic measurements within the instrument, to diagnose faults and verify proper calibration and operation. Use of the MUX has been found advantageous in the present invention.

Figure 8:
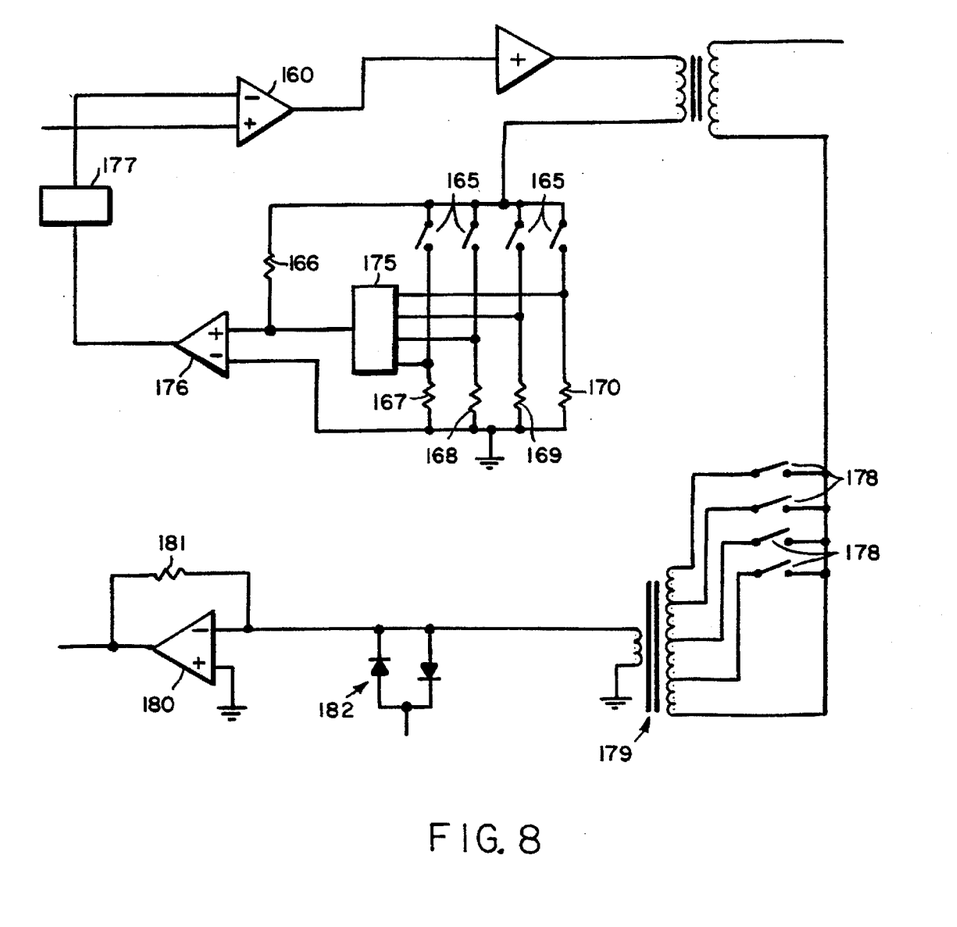
FIG. 8 is a circuit diagram illustrating the current output driver, local feedback circuit and output current sampling circuit.

FIG. 8 illustrates the current channel output stage. Here, an input signal of ten volts RMS is transformed into an output of up to 10 amperes RMS. The output stage includes an amplifier driving a current transformer, a local feedback circuit, ranging relays that select local feedback shunt and the means for selecting the gain of the local and main feedback. Because of the dynamic digital correction, the gain of the output stage need not be tightly controlled and compensated for all current levels and all frequencies.

The amplifier, 161, receives its input from the output of the summing amplifier, 160, and drives the current transformer, 163. The output of the amplifier is −10 amperes RMS max and 5 volts RMS max.

Local feedback is accomplished by sensing the primary current of the current transformer by use of selectable sampling resistors, an instrumentation amplifier and a selectable gain amplifier. FIG. 8, 165 illustrates the selection relay contacts for the local feedback, 175 illustrates the analog multiplexer ("MUX") used in conjunction with the relays; the actuation of the relays and the selection of the MUX path is controlled by the host microprocessor.

The selection of sampling resistors, 167–170, and the selection analog multiplexer, 175, are used to scale local feedback.

To provide more flexibility, the local feedback loop contains a selectable gain amplifier, 177, which is controlled by the current host microprocessor. By changing the gain of this amplifier the gain, or more properly, transconductance, of the current channel output can be controlled. The output of the selectable gain amplifier is connected to the negative input of a summing amplifier whose positive input is driven directly by the main waveform and correction summing amplifier, FIG. 7, 140.

The selected sensing path is coupled through a analog MUX, 175, to the input of a gain-of-eight instrumentation amplifier, 176. Another feature of this implementation is the bypass resistor, 166, which reduces the current flow through the primary of 163 to very nearly zero when none of the relays, 165, are energized.

In the present invention, it was found desirable to set a minimum time interval for the data points in the correction waveform. This minimum interval is set to be longer than the time delay of the power amplifier. In the presently preferred commercial embodiment of the invention illustrated, the minimum interval for the voltage amplifier it is 80 microseconds; for the internal current amplifier it is 200 microseconds; and for the external current amplifier it is 360 microseconds. If an interval shorter than the minimum is used, the digital feedback becomes unstable and the unit shuts down. The minimum interval should also be long enough to include the increased amplifier time delay caused by different loads.

The current output is sensed using a current transformer, FIG. 9, 179, which has multiple primary taps which are selected by relay contacts, 178. By selecting the appropriate primary tap, the current transformer's maximum output is 12.5 milliamperes RMS for each range. The transformer output is applied to the transresistance amplifier, 180 with protection diodes, 182

The transresistance amplifier, 180 has a feedback resistor, 181, of 400 ohms which allows it to convert each 2.5 milliamperes of input current received from transformer, 179, to −1 volt. The voltage output of 180 is summed with a voltage proportional to the desired current output by FIG. 7, 146 to create an error signal. This is the outer or main digital feedback path.

The amplitude for the output waveform is controlled in a coarse steps by changing ranges and in fine steps, within a range, by control of the Main Waveform D/As reference voltage. Once the range setting is made, which might include actuating relays and changing amplifier gain settings, a value is read from the DSP memory and written to the Amplitude D/As, 40, 41 & 120, 121. The value written to the Amplitude D/A sets magnitude of the reference voltage for the main waveform D/A and thus acts as an amplitude control for the waveform. The Amplitude D/A may be reset with new values during the operation of the instrument.

All channels have the waveform they are to generate loaded into a digital table in their DSP RAM memory. The table for each channel has the same number of elements, each element represents a normalized amplitude sample that is to be sent to the main waveform D/A for that channel at a particular instant in time. In order to shift the phase from channel to channel, the waveform is recalculated with the phone shift added. An understanding of this technique may be gained by studying the example in the following paragraphs.

This example is for a system using 400 samples per cycle where both current and voltage are sine waves and current is leading voltage by 45 degrees.

First, the main voltage waveform table containing 400 elements, one for each sample, is generated loaded by the host microprocessor. The first sample—element 0—is loaded with the value for 0 degrees—0 amplitude; each succeeding element is loaded with desired value for the waveform 360/400 degrees further along. Next, the corresponding main current waveform table is loaded, the first sample—element 0—is loaded with the value for +45 degrees—+0.707 amplitude; each succeeding element is loaded with value for the waveform 360/400 degrees further along. Once the tables are loaded, the phase relationship between channels is fixed and will not change until is intentionally changed by rewriting the table.

In addition to storing amplitude and waveshape information, each channel's DSP Memory contains a table of output correction values. The table of correction values contains exactly the same number of elements as the corresponding waveform table. Correction values are read from memory and updated based on data gathered from the Error A/D; other correction values are read from memory and sent to the Correction D/A. In addition calculating correction values, steps are included to check for overrange conditions and to remove any DC offset as described previously.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A precision a.c. signal source comprising:
   an amplifier for applying an output waveform to a load;
   a first memory holding digital reference values representing the relative amplitude of a desired waveform at a succession of phase points;
   a first digital to analog converter;
   a second memory for storing a set of digital correction values corresponding to respective ones of said reference values;
   a second digital to analog converter;
   sequencing means for applying successive values read from said first memory to said first digital to analog converter to generate a reference waveform and for synchronously applying successive corresponding values read from said second memory to said second digital to analog converter to generate a correction waveform;
   means for combining said reference and correction waveforms and applying the combined waveform to the input of said amplifier, the output of said amplifier being applied to said load resulting in said output waveform;
   means for combining said reference waveform and said output waveform to generate an error waveform;
   an analog to digital converter for generating a succession of digital error values corresponding to said error waveform; and
   processor means responsive to said successive digital error values for repetitively adjusting said correction values in a sense which reduces the difference between said reference waveform and said output waveform.

2. An a.c. signal source as set forth in claim 1 wherein said digital error values are stored in a third memory during one a.c. cycle and are employed to adjust said correction values during the next a.c. cycle.

3. An a.c. signal source as set forth in claim 1 wherein the interval between said phase points is smaller than the delay of said amplifier.

4. An a.c. signal source as set forth in claim 1 wherein said reference waveform and said output waveform are combined by analog summing.

5. An a.c. signal source as set forth in claim 1 wherein said processor is a digital signal processor.

6. A precision a.c. signal source comprising:
   an amplifier for applying an output waveform to a load, said amplifier being characterizable by a predetermined delay value;
   a first memory holding digital reference values representing the relative amplitude of a desired waveform at a succession of phase points, the interval between said phase points being smaller than said delay value;
   a first digital to analog converter;
   a second memory for storing a set of digital correction values corresponding to respective ones of said reference values;
   a second digital to analog converter;
   sequencing means for applying successive values read from said first memory to said first digital to analog converter to generate a reference waveform and for synchronously applying successive corresponding values read from said second memory to said second digital to analog converter to generate a correction waveform;
   means for combining said reference and correction waveforms by analog summing and applying the combined waveform to the input of said amplifier, the output of said amplifier being applied to said load resulting in said output waveform;
   means for combining said reference waveform and said output waveform by analog summing to generate an error waveform;
   an analog to digital converter for generating a succession of digital error values corresponding to said error waveform, said error values being stored in a third memory; and
   processor means for repetitively adjusting said correction values as a function of said successive digital error values in a sense which reduces the difference between said reference waveform and said output waveform.

7. A precision a.c. voltage and current source comprising:
   a voltage channel including an amplifier for applying a voltage waveform to a load;
   a current channel including an amplifier for applying a current waveform to a load;
   in each of said channels,
   a first memory holding digital reference values representing the relative amplitude of a desired waveform at a succession of phase points;
   a first digital to analog converter;
   a second memory for storing a set of digital correction values corresponding to respective ones of said reference values;
   a second digital to analog converter;
   means for applying successive values read from said first memory to said first digital to analog converter to generate a reference waveform and for synchronously applying successive corresponding values read from said second memory to said second digital to analog converter to generate a correction waveform;
   means for combining said reference and correction waveforms and applying the combined waveform to the input of the respective amplifier, the output of said amplifier being applied to said load resulting in a respective output waveform;
   means for combining said reference waveform and said output waveform to generate a respective error waveform;
   an analog to digital converter for generating a succession of digital error values corresponding to the respective error waveform; and
   means responsive to said successive digital error values for repetitively adjusting the respective correction values in a sense which reduces the difference between said reference waveform and said output waveform.

8. A precision multi-phase a.c. voltage and current source comprising:

for each phase, a voltage channel including an amplifier for applying a voltage waveform to a load;

for each phase, a current channel including an amplifier for applying a current waveform to a load;

in each of said voltage and current channels, a first memory holding digital reference values representing the relative amplitude of a desired waveform at a succession of phase points;

a first digital to analog converter;

a second memory for storing a set of digital correction values corresponding to respective ones of said reference values;

a second digital to analog converter;

means for applying successive values read from said first memory to said first digital to analog converter to generate a reference waveform and for synchronously applying successive corresponding values read from said second memory to said second digital to analog converter to generate a correction waveform;

means for combining said reference and correction waveforms by analog summing and applying the combined waveform to the input of the respective amplifier, the output of said amplifier being applied to said load resulting in a respective output waveform;

means for combining said reference waveform and said output waveform by analog summing to generate a respective error waveform;

an analog to digital converter for generating a succession of digital error values corresponding to the respective error waveform; and means responsive to said successive digital error values for repetitively adjusting the respective correction values in a sense which reduces the difference between said reference waveform and said output waveform, the timing of reading from the memory sections in each of said current channels being adjustable in relation to the timing of reading from the memory sections in the respective voltage channels thereby to vary the relative phasing of the current voltage output waveforms.

\* \* \* \* \*